United States Patent [19]

Kaufman

[11] 4,449,165
[45] May 15, 1984

[54] COMPACT CIRCUIT PACKAGE HAVING AN IMPROVED LEAD FRAME CONNECTOR

[76] Inventor: Lance R. Kaufman, 131 White Oak Way, Mequon, Wis. 53092

[21] Appl. No.: 353,177

[22] Filed: Mar. 1, 1982

[51] Int. Cl.³ ............................................. H05K 7/20
[52] U.S. Cl. .................................. 361/386; 361/399; 361/421; 339/258 S
[58] Field of Search ....................... 219/522, 541, 203; 174/16 HS; 357/79, 81; 361/386, 387, 388, 399, 400, 403, 404, 405, 412, 418, 421, 395; 339/256 SP, 258 S, 275 T, 112 R

[56] References Cited

U.S. PATENT DOCUMENTS

| | | | |
|---|---|---|---|
| Re. 28,295 | 1/1975 | Peetz et al. | 219/522 |
| 3,501,598 | 3/1970 | Lis | 361/412 |
| 3,801,728 | 4/1974 | Gallo, Jr. | 174/525 |
| 4,218,724 | 8/1980 | Kaufman | 361/412 |

OTHER PUBLICATIONS

Power Hybrid Module, Liv, IBM Tech. Discl. Bull., vol. 16, No. 11, Apr. 1974, pp. 3826, 3827.

*Primary Examiner*—G. P. Tolin
*Attorney, Agent, or Firm*—Andrus, Sceales, Starke & Sawall

[57] ABSTRACT

A compact circuit package (11) includes an electrically insulating heat conducting substrate (19) providing a substantially planar surface connected to substantially enclose a circuit containing cavity (16) provided by an electrically insulating housing (12). A lead frame connector (23) includes a fixed section (30) permanently bonded to the substrate surface (20) and a movable tab portion (29) which is separated from the fixed section (30) by a pair of spaced substantially parallel slots (25). The movable tab (29) lies along the substrate surface (20) without being bonded thereto and is bendable along a bend line (28) in response to axially movement of an inter-connected lead frame extension (32). A pair of spaced projections (35, 36) on the lead frame extension (32) engage a stop provided by an inner wall surface (13) of the housing (12) to limit movement of the inter-connected tab (29) and lead frame extension (32) without damaging the permanent bond between the fixed section (30) and the substrate (19).

7 Claims, 4 Drawing Figures

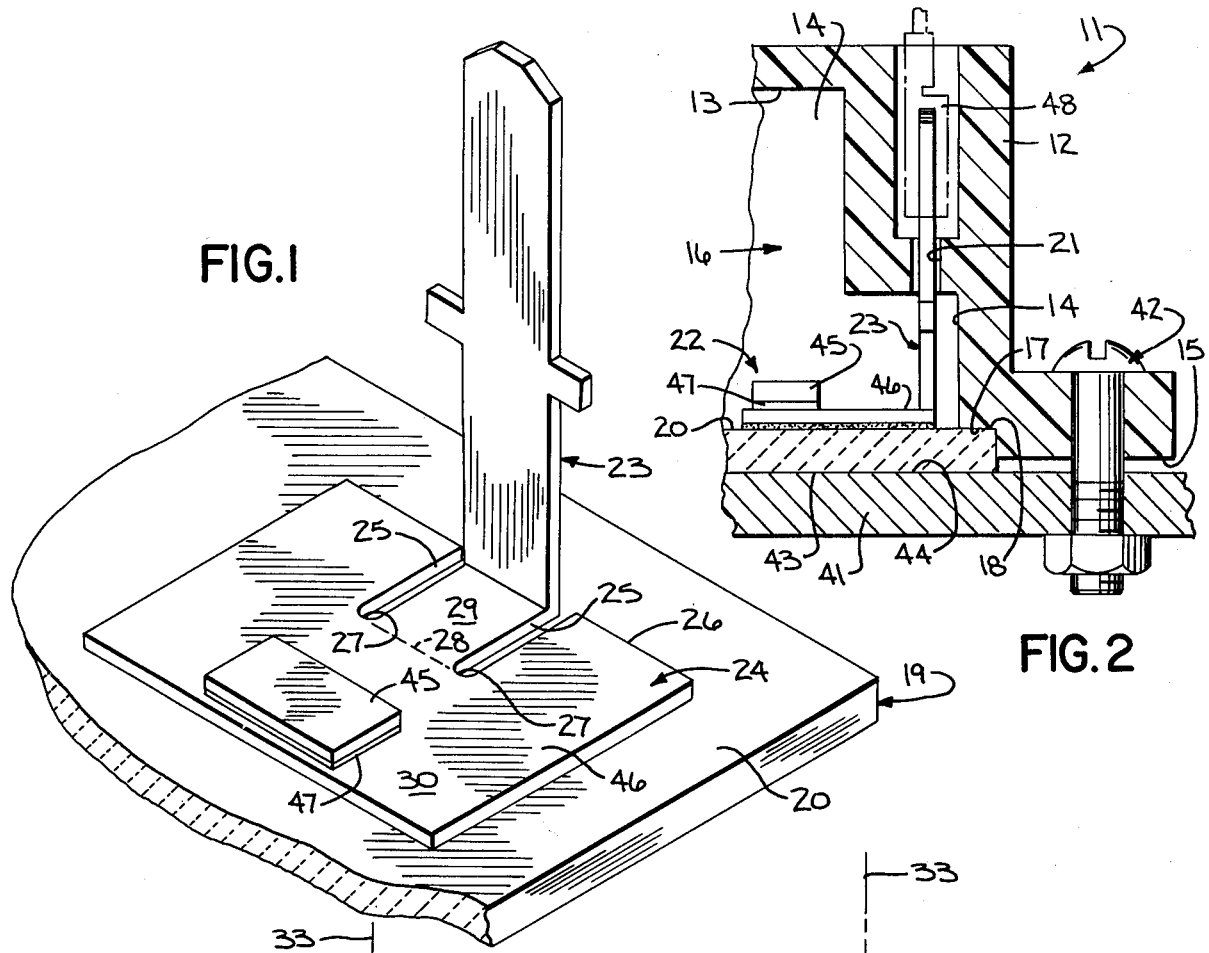
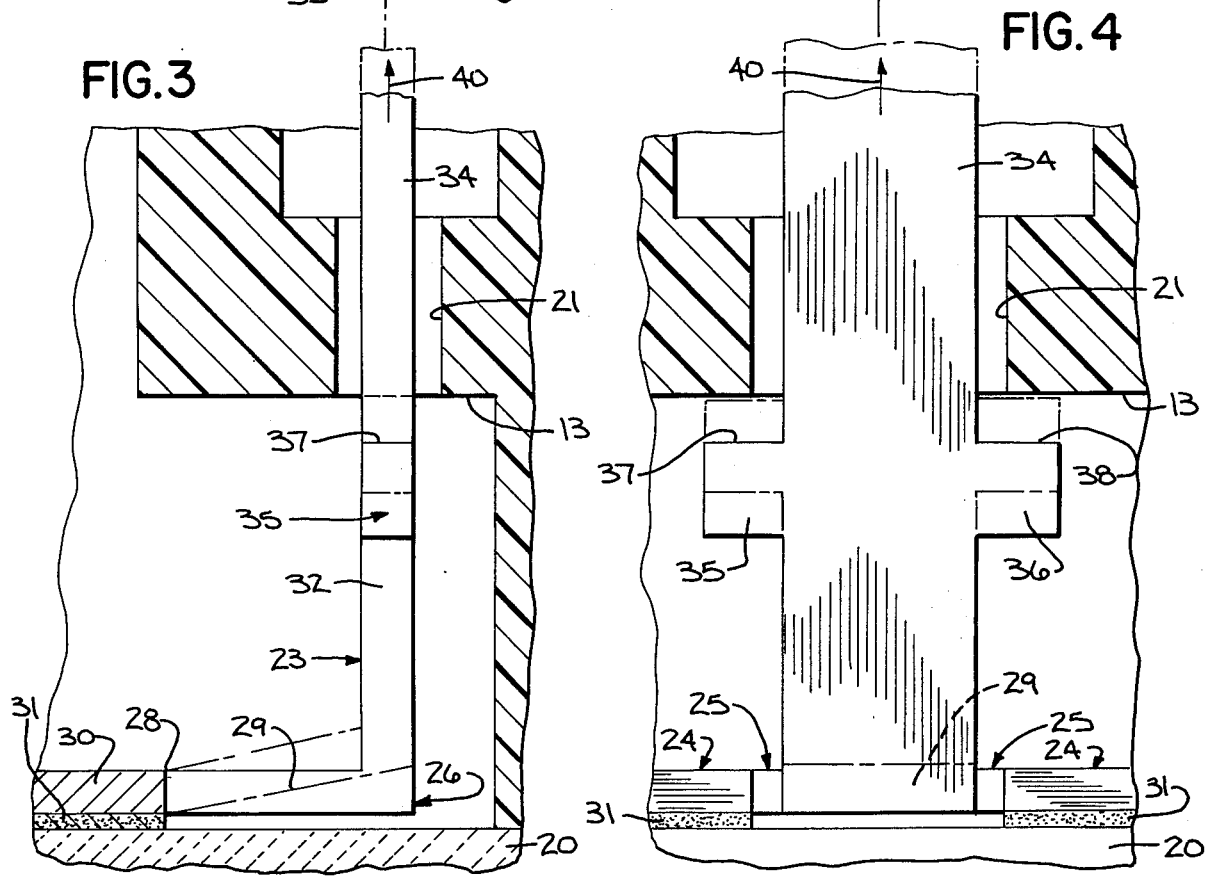

COMPACT CIRCUIT PACKAGE HAVING AN IMPROVED LEAD FRAME CONNECTOR

BACKGROUND OF THE INVENTION

This invention relates to a compact circuit package having an improved lead frame connector.

Lead frames and thick film circuits have been advantageously employed with respect to heat conducting, electrically insulating substrates. In many constructions, a lead frame sub-assembly is placed upon solder paste or conductive epoxy located on the insulating substrate. The intervening solder or epoxy is reflowed by heat or other means to permanently bond portions of the lead frame sub-assembly to the substrate. In addition, other discrete components may be placed upon certain portions of the lead frame sub-assembly or upon portions of the thick film circuit and permanently bonded thereto by reflowing the interconnected solder paste or conductive epoxy. Portions of the lead frame sub-assembly may be detached so that a sub-assembly is formed which includes the insulating substrate and a series of lead frame portions which are each bonded to the substrate by the reflowed solder or conductive epoxy. Portions of the lead frame may be bent normal to the substrate to form electrical terminal connections which may function to conduct large amounts of current to operating circuits which may include various components such as high power conducting semi-conductor devices. Such construction is particularly useful in high power energy conversions such as employed with electric motor drives or the like. One highly desirable construction is shown in the U.S. Pat. No. 3,958,075 entitled "High Power Thick Film Circuit With Overlapping Lead Frame", which issued on May 18, 1976 to Lance R. Kaufman.

In one desirable construction, one or more lead frame connectors are bonded to a pair of spaced substrates lying in the same plane with the lead frame connectors thereafter bent into U-shaped configurations so that one portion of each lead frame connector and attached substrate is spaced in parallel with another portion of the lead frame connector and attached second substrate. Such construction has been found to be highly desirable in positioning a photon emitting control element in spaced relationship with a photon activated switch operating in a solid state power control device, such as shown in the U.S. Pat. No. 4,156,148 entitled "Photocoupling Structure For A Solid State Power Control Device", which issued on May 22, 1979 to Lance R. Kaufman.

Sub-assemblies including lead frames attached to an insulating substrate have been advantageously placed within an insulating housing. Such housings have included a cavity surrounded by one or more edges which engage the substrate to limit its depth of entry into the cavity. The use of such limiting edge avoids pressure being placed upon the circuit elements to permit thermal contraction and expansion of the circuit elements in response to heat generated by the conducted electrical energy. Such thermal expansion and contraction is particularly desirable in high power conducting solid state devices such as thyristors or the like. One highly desirable device is shown in U.S. application Ser. No. 834,601 now U.S. Pat. No. 4,394,530 entitled "Power Switching Device Having Improved Heat Dissipation Means", which was filed on Sept. 19, 1977 by Lance R. Kaufman.

Plural electrically insulating substrates each containing respective interconnected lead frame connectors have been advantageously employed within a compact circuit package. Under certain conditions, selected lead frame connectors which are mounted to one substrate engage selected lead frame connectors mounted to another substrate at or within housing apertures providing external electrical connection to such lead frame connectors. One desirable construction is shown in U.S. Pat. No. 4,218,724 entitled "Compact Circuit Package Having Improved Circuit connectors", which issued on Aug. 19, 1980 to Lance R. Kaufman.

Compact circuit packages are capable of retaining a wide variety of circuit constructions mounted upon one or more of the substrates. By way of example, an electrical power converting thyristor firing circuit could be used, such as disclosed in U.S. Pat. No. 4,257,091 entitled "Electrical Power Converter Thyristor Firing Circuit Having Noise Immunity", which issued on Mar. 17, 1981 to Lance R. Kaufman. Optically couplable circuit elements could be used as shown in U.S. Pat. No. 4,266,140 entitled "Positioning Means For Optically Couplable Circuit Elements", which issued on May 5, 1981 to Lance R. Kaufman. One or more terminals could be used for the main input and output power connections such as disclosed in U.S. Pat. No. 4,215,235 entitled "Lead Frame Terminal", which issued on July 29, 1980 to Lance R. Kaufman. One or more variable resistance devices could be used such as disclosed in U.S. Pat. No. 4,250,481 entitled "Variable Resistance Device For Thick Film Circuitry", which issued on Feb. 10, 1981 to Lance R. Kaufman. One or more dual resistor elements could be used such as disclosed in U.S. Pat. No. 4,196,411 entitled "Dual Resistor Element", which issued on Apr. 1, 1980 to Lance R. Kaufman. Numerous other circuits and elements could also be utilized.

SUMMARY OF THE INVENTION

A compact circuit package includes an electrically insulating housing providing a circuit containing cavity having an aperture to permit external electrical access to the cavity. An electrically insulating heat conducting substrate is connected to the housing and provides a first side facing the cavity. A lead frame connector includes a first lead frame portion extending along a first portion of the substrate first side and includes a first section which is permanently affixed to the substrate and a second section which is electrically connected to the first section and movable with respect to the substrate. A second lead frame portion is operatively connected to the second section and is located generally along a predetermined axis within the aperture to provide for external electrical connection and includes an abutment to selectively engage a stop provided by the housing to limit movement of the second lead frame portion and the second section in response to force exerted upon the lead frame connector along the axis without disengaging the first section from the substrate.

The lead frame connector has been found to be highly desirable when used with selectively engagable external electrical connectors which may exert a force along the lead frame connector which might otherwise tend to remove the inter-connection between the lead frame connector and the heat conducting electrically insulating substrate. Limited movement of the lead frame extension is permitted without damaging the bond between the lead frame connector and substrate, such as frequently provided by solder, thick film circuitry, epoxy resin or other suitable bonding agent. Movement of the lead frame extension, however, is limited by the lead frame abutment engaging a stop provided by the housing to prevent the circuit constructions from being damaged.

The first lead frame member includes a substantially planar configuration containing a pair of spaced substantially parallel slots which communicate with a side edge. The second section is located between the spaced slots and is free of any bonding agent so as to be movable with respect to the underlying substrate. The second section is permitted to bend along a bending line adjacent to the ends of the slots.

The second lead frame member includes a lead frame extension integrally joined to the second lead frame section and includes an outer portion located within the housing aperture to provide for external electrical connection. The lead frame engagement member includes a projection which is spaced from the second lead frame section and the lead frame outer portion and is positioned to selectively engage the housing stop in response to force along the axis of the lead frame extension.

The lead frame engagement member may include a pair of oppositely spaced lateral projections which extend normal to the axis of the lead frame extension to be located adjacent to the housing wall for selective engagement with such housing wall in response to force along the lead frame extension axis.

The lead frame connector provides a highly desirable bendable tab which is free of any intervening solder or bonding agent and is integrally joined with a lead frame extension having an abutment selectively engagable with a housing stop to limit axial movement of such lead frame extension without damaging the permanent bond between a lead frame section permanently affixed to the substrate.

BRIEF DESCRIPTION OF THE DRAWINGS

FIG. 1 is a perspective view of a sub-assembly showing an inter-connection between a lead frame connector and an electrically insulating heat conducting substrate;

FIG. 2 is a partial sectional illustration of a compact circuit package showing the sub-assembly of FIG. 1 sandwiched between an insulating housing and a heat sink;

FIG. 3 is a diagramatic illustration of a portion of the elements illustrated in FIG. 2; and FIG. 4 is a side view of the diagram of FIG. 3.

DETAILED DESCRIPTION OF THE PREFERRED EMBODIMENT

A compact circuit package 11 includes an electrically insulating housing 12 having a base wall 13 surrounded by a peripheral wall 14. An outer rim 15 surrounds the peripheral wall 14 and is spaced from the inner wall 13 to define an inner cavity 16. One or more projections 17, which may include a continuous ridge or a series of spaced ledges, are formed along sidewall 14 and engage a peripheral side edge 18 of an electrically insulating, heat conducting substrate 19. The engagement of the peripheral edge 18 of substrate 19 with the lip or ridge 17 limits the depth of entry of substrate 19 into cavity 16. A substantially planar surface 20 of substrate 19 faces inwardly to substantially enclose the cavity 16.

The housing 12 includes one or more apertures 21 located adjacent to one or more of the sidewalls 14 to permit external electrical access to circuitry within the cavity 16. Such housing construction is more fully shown in U.S. Pat. No. 4,218,724 which issued on Aug. 19, 1980 to Lance R. Kaufman.

One or more circuit assemblies 22 are located along surface 20 of substrate 19. One such circuit element includes a lead frame connector 23 which is bonded to surface 20 of substrate 19 and further extends through aperture 21 of housing 12 for selective external electrical connection. The lead frame connector 23 includes a substantially planar lead frame portion 24 having a pair of spaced, substantially parallel slots 25 which communicate with a side edge 26 of portion 24 and extend inwardly to ends 27. A bend line 28 is defined along a line connecting the ends 27 of slots 25 to define a movable tab 29 surrounded by slots 25, side edge 26 and bend line 28. The remainder of the planar lead frame portion 24 outside of the movable tab 29 defines a fixed section 30 which is permanently bonded to surface 20 of substrate 19 through an intervening layer of solder, metalization or other suitable bonding material 31.

A lead frame extension 32 is integrally joined to the tab 29 at the planar side edge 26 and extends along a longitudinal axis 33 which is substantially normal with respect to the fixed section 30. An outer portion 34 of the lead frame extension 32 is located within the housing aperture 21 to be in a position for selective electrical connection to an external connector 48 to provide an electrical circuit connection to the circuit assemblies 22. A pair of oppositely spaced lateral projections 35 and 36 extend normal to the longitudinal axis 33 and include a pair of spaced ledges 37 and 38, respectively, which are spaced from the outer portion 34 and the tab 29. The pair of ledges 37 and 38 are located immediately adjacent to the housing wall surface 13 which, in turn, provides a stop to limit movement of the lead frame extension 32 along axis 33 in a direction 40.

In one form of construction, the housing 12 may be bolted to an external heat sink 41 through a series of spaced nut and bolt assemblies 42 to firmly clamp a substantially planar surface 43 of substrate 19 against a corresponding substantially planar surface 44 of heat sink 41.

In operation, external electrical connectors 48, such as more fully illustrated in the U.S. Pat. No. 4,218,724, may be selectively attached to the outer portion 34 of the lead frame extension 32 to provide a current conducting path through extension 32, movable pad 29 and fixedly connected section 30 to provide an electrical circuit to the circuit assemblies 22. By way of example, a diagramatically illustrated thyristor 45 is attached to an upper surface 46 of the fixed section 30, such as through metalization, thick film circuitry or other suitable bonding agent. The lead frame connector 23, in turn, could also be bonded to other circuits such as thick film circuits applied either along surface 20 of substrate 19 or along surface 46 of lead frame portion 24.

A mechanical disconnection of the removable terminal 48 may, in certain instances, provide the upwardly directed force 40 tending to move the lead frame extension 32 along axis 33. The engagement of projections 37 and 38 against the housing wall surface 13 provides a stop to limit the relative movement of extension 32. The tab portion 29 is permitted to bend along bend line 28, such as illustrated in phantom in FIG. 3, in response to the limited movement of extension 32 along axis 33. Such construction advantageously permits the lead frame section to remain permanently bonded through the metalization 31 or similar bonding material in a highly desirable construction.

Various modes of carrying out the invention are contemplated as being within the scope of the following claims which particularly point out and distinctly claim the subject matter which is regarded as the invention.

I claim:

1. A compact circuit package, comprising
an electrically insulating cup-shaped housing having an open bottom side and providing a circuit containing cavity and having an aperture in the top side to permit external electrical access to said cavity and a stop located adjacent to said aperture,
an electrically insulating heat conducting substrate closing the open bottom side of said housing and having a first side facing upwardly toward said cavity, and
a lead frame connector including
first lead frame means extending along a first portion of said substrate first side and including
a first section permanently affixed to said substrate and
a second section electrically connected to said first section and movable with respect to said substrate and
second lead frame means operatively connected to said second section and located generally along a predetermined axis within said aperture to provide for external electrical connection and including means to selectively engage said housing stop to limit movement of said second lead frame means and said second section in response to force along said axis without disengaging said first section from said substrate.

2. The compact circuit package of claim 1, wherein said first lead frame means includes a substantially planar member containing a pair of spaced substantially parallel slots communicating with a member side edge, said second section being located between said slots about a bend line located adjacent to the ends of said slots.

3. The compact circuit package of claim 2, wherein said first section is connected to said second section through said bend line.

4. The compact circuit package of claim 1, wherein said second lead frame means includes a lead frame extension integrally joined to said second section and including an outer portion located within said housing aperture to provide for external electrical connection and
said engagement means includes a projection spaced from said second section and said outer portion and positioned to selectively engage said housing stop in response to force along said axis.

5. The compact circuit package of claim 4, wherein said stop includes a housing wall facing said cavity, and
said engagement means includes a pair of oppositely spaced lateral projections extending normal to said axis to be located adjacent to said housing wall for selective engagement with said housing wall in response to force along said axis.

6. A lead frame connector for a compact circuit package providing an electrically insulating heat conducting substrate having a first side operatively retaining a circuit located within a cavity provided by an electrically insulating housing to conduct heat generated by said circuit through said substrate to a point external to said cavity, wherein the improvement in said lead frame connector comprising
a substantially planar lead frame portion to be located adjacent to said substrate first side and including a pair of spaced substantially parallel slots communicating with a side edge of said planar portion to define
a tab located between said slots and movable with respect to said substrate along a bend line located adjacent to an end of said slots and
a fixed section integrally joined to said tab through said bend line to be permanently affixed to said planar first side, and
a lead frame extension integrally joined to said tab at said planar side edge and extending substantially normal to said fixed section along a longitudinal axis and including
an outer portion to be extended into an aperture within said housing and selectively electrically connected to provide external electrical connection for said circuit package and
a pair of oppositely spaced lateral projections on said lead frame extension extending normal to said longitudinal axis and spaced from said tab and said outer portion to be located adjacent to an inner wall of said housing and providing a pair of spaced ledges to engage said housing wall in response to force along said longitudinal axis in a direction away from said tab
with said tab flexing along said bend line to permit limited movement of said lead frame extension along said longitudinal axis without disengaging said planar fixed section from said substrate.

7. A compact circuit package, comprising
an electrically insulating housing having a cavity formed by a base wall surrounded by a peripheral wall terminating at a rim to form a circuit receiving receptacle and including an aperture within said base wall to provide external electrical access to said cavity,
an electrically insulating heat conducting substrate connected to said housing adjacent to said rim and having a first side facing said cavity to substantially enclose said cavity,
a heat generating circuit located adjacent to said substrate first side and generating heat along said substrate first side in response to the selective conduction of current therethrough, and
a lead frame connector electrically connected to said heat generating circuit and extending through said base wall aperture and including
a substantially planar lead frame portion located adjacent to said substrate first side and including a pair of spaced substantially parallel slots communicating with a side edge of said planar portion to define
a tab located between said slots and movable with respect to said substrate along a bend line located adjacent to an end of said slots and
a fixed section integrally joined to said tab through said bend line permanently affixed to said planar first side and
a lead frame extension integrally joined to said tab at said planar side edge and extending substantially normal to said fixed section along a longitudinal axis and including
an outer portion located within said housing aperture and selectively electrically connected to provide external electrical connection to said heat generating circuit and
a pair of oppositely spaced lateral projections extending normal to said longitudinal axis and spaced from said tab and said outer portion to be located adjacent to said base wall and providing a pair of spaced ledges to engage said base wall in response to force along said longitudinal axis in a direction away from said tab with said tab flexing along said bend line to permit limited movement of said lead frame extension along said longitudinal axis without disengaging said planar fixed section from said substrate.

* * * * *